United States Patent [19]

Iyer et al.

[11] Patent Number: 5,323,155
[45] Date of Patent: Jun. 21, 1994

[54] SEMI-STATIC DATA COMPRESSION/EXPANSION METHOD

[75] Inventors: Balakrishna R. Iyer, San Jose, Calif.; Teresa A. Meriwether, Cary, N.C.; Elton B. Sherwin, Jr., Stamford, Conn.; Bhaskar Sinha, Boxford, Mass.

[73] Assignee: International Business Machines Corporation, Armonk, N.Y.

[21] Appl. No.: 985,409

[22] Filed: Dec. 4, 1992

[51] Int. Cl.$^5$ .............................................. H03M 7/30
[52] U.S. Cl. ...................................... 341/51; 341/106
[58] Field of Search ........................... 341/51, 67, 106

[56] References Cited

U.S. PATENT DOCUMENTS

| | | | |
|---|---|---|---|
| 4,464,650 | 8/1984 | Eastman et al. | 341/51 |
| 4,558,302 | 12/1985 | Welch | 341/51 |
| 4,701,745 | 10/1987 | Waterworth | 341/63 |
| 4,725,815 | 2/1988 | Mitchell et al. | 341/67 |
| 4,814,746 | 3/1989 | Miller et al. | 341/95 |
| 4,843,389 | 6/1989 | Lisle et al. | 341/106 |
| 4,847,619 | 7/1989 | Kato et al. | 341/106 |
| 4,876,541 | 10/1989 | Storer | 341/51 |
| 4,881,075 | 11/1989 | Weng | 341/87 |
| 4,899,147 | 2/1990 | Schiavo et al. | 341/60 |
| 4,899,148 | 2/1990 | Shimazaki et al. | 341/65 |
| 4,906,991 | 3/1990 | Fiala et al. | 341/51 |
| 4,988,998 | 1/1991 | O'Brien | 341/55 |
| 5,010,344 | 4/1991 | Nagy et al. | 341/65 |
| 5,010,345 | 4/1991 | Nagy et al. | 341/65 |
| 5,045,852 | 9/1991 | Mitchell et al. | 341/51 |
| 5,049,880 | 9/1991 | Stevens | 341/63 |
| 5,049,881 | 9/1991 | Gibson et al. | 341/95 |
| 5,087,913 | 2/1992 | Eastman | 341/95 |
| 5,175,543 | 12/1992 | Lantz | 341/51 |

OTHER PUBLICATIONS

Langdon, "A Note on Ziv-Lempel Model for Compressing Individual Sequences", IEEE Trans. on Info. Theory, vol. IT-29, No. 2, pp. 284-287, Mar. 1983.
Langdon, "On Parsing Versus Order Model Structure for Data Structure" IBM SJ report RJ-4163, 31 p., Jan. 1984.
Welch, "A Technique for High-Performance Data Compression", IEEE Computer, pp. 8-19, Jun. 1984.
Miller and Wagman, "Variations on a Theme by Ziv and Lempel", IBM Yorktown Report No. RC-10630, Jul. 1984.

(List continued on next page.)

*Primary Examiner*—Marc S. Hoff
*Attorney, Agent, or Firm*—Bernard M. Goldman

[57] ABSTRACT

A method of transmitting compressed data using a Ziv-Lempel compression/expansion algorithm, using an adaptive Ziv-Lempel (AZL) dictionary modified to a mature state. The mature state is signaled by a time to freeze signal sent as a switch-over signal from a transmitting location to each receiving location. These signals freeze and synchronize the AZL dictionaries at both locations, and starts a translation of the frozen AZL dictionary to a static SZL dictionary—at least at the transmitting location. The SZL dictionary is then used to compress records being transmitted. An index translation process is generates translation information to allow the receiving locations to decompress SZL indices into original characters. The AZL-to-SZL dictionary translation process re-organizes the frozen AZL to an SZL dictionary. The SZL process is used until either the end of the inputted sequence, or a time to unfreeze signal is generated. An SZL to AZL switch-over signal is generated in response to the time to unfreeze signal, which in turn signals a switch over back to the AZL process and invokes the saved frozen AZL dictionary to be used to until mature to on the current input data stream at which time the AZL is frozen and a switch-over signal is provided and a new SZL is generated.

18 Claims, 4 Drawing Sheets

OTHER PUBLICATIONS

Mayne and James, "Information Compression by Factorizing Common Strings", The Computer Journal, vol. 18, No. 2, pp. 157–161, 1973.

Rodeh et al., "Linear Algorithm for Data Compression Via String Matching", MIT Report Tr-060, p. 63, Dec. 1977.

Ziv & Lempel, "Compression of Individual Sequences via Variable-Rate Coding", IEEE Trans. on Info. Theory, vol. IT-24, No. 5, pp. 530–536, Sep. 1978.

Langdon, "A Note on Ziv-Lempel Model for Compressing Individual Sequences", IBM SJ Report RJ-3318 15 p., Nov. 1981.

Rissanen, "Improved Ziv-Limpel Type Data Compression Method", IBM Technical Disclosure Bulletin, vol. 28, No. 3, pp. 996–997, Aug. 1985.

Crochemore, M., "Data Compression With Substitution", Saint Pierre d'Oleron, France pp. 1–16, May 1987.

A. D. Clark, "Adaptive Source Coding Technique for Communications Systems", British Telecommunications Plc., pp. 53–60, 1989.

Cohn, "N89 22348/1/XAB Performance of Lempel-Ziv Compressors with Deferred Innovation", NASA, Feb. 1989.

Bunton et al., "Practical Dictionary Management for Hardware Data Compression", MIT Press, Apr. 1990.

Yokoo, "A Lossless Coding Algorithm for the Compression of Numerical Data", Trans. Inst. Electron. Eng. E (Japan), vol. E73, No. 5, pp. 638–643, May 1990.

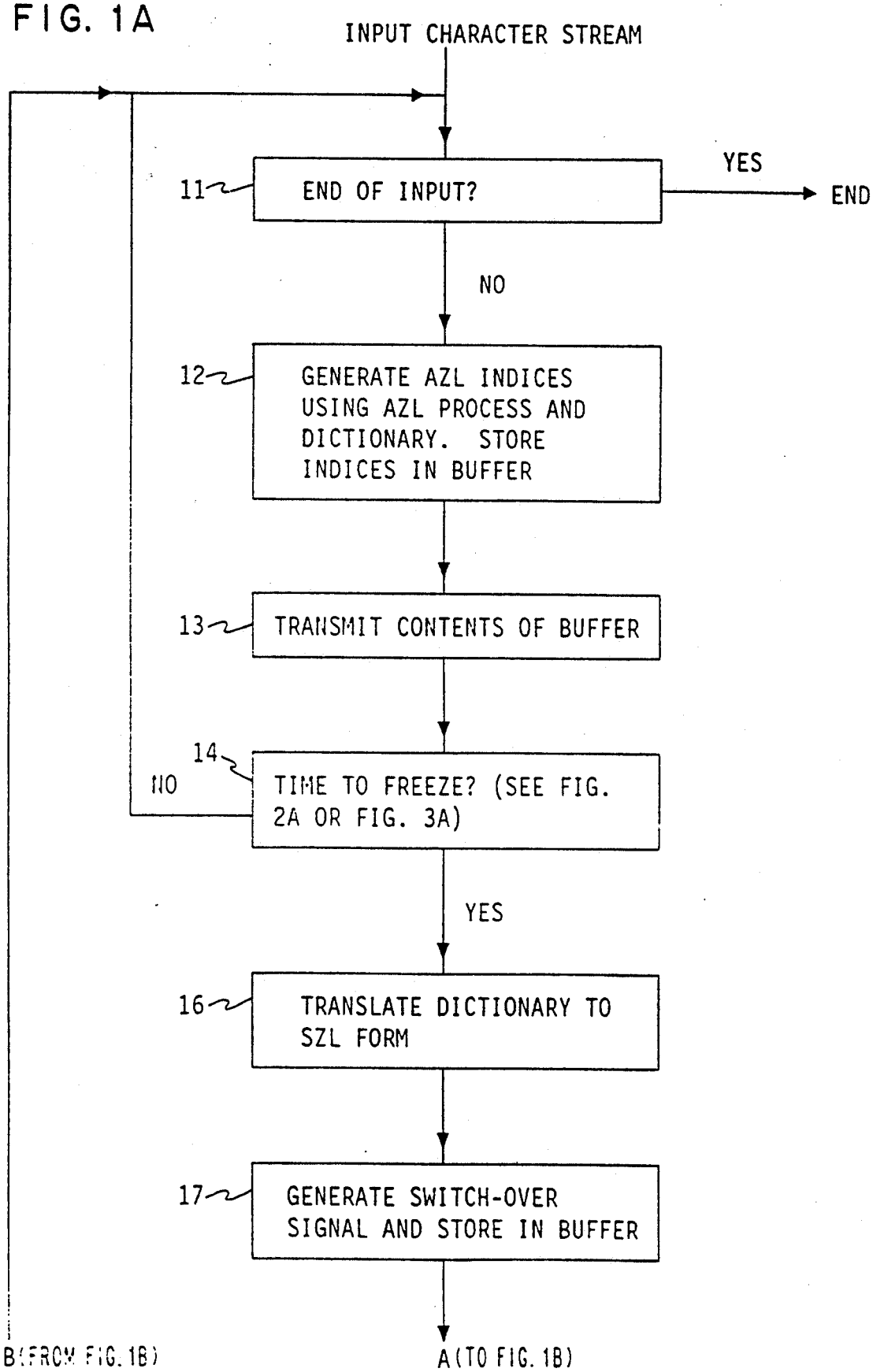

SEMI-STATIC DATA COMPRESSION/EXPANSION METHOD

INTRODUCTION

This invention relates to a semi-static manner of using the Ziv-Lempel (ZL) process of compressing and expanding computer data.

BACKGROUND

The adaptive Ziv-Lempel (AZL) process is presently used by many commercial computer systems to reduce the storage space required by data files. The AZL process is disclosed in a number of prior filed patent applications, such as in U.S. Pat. No. 4,814,746 to Miller and Wegman assigned to the same assignee as the subject application. It describes and claims a ZL compression dictionary using an LRU (least recently used) replacement technique for continuously adapting (modifying) the dictionary to new input data strings being compressed when the dictionary runs out of unused entries to accommodate new input data character strings.

The ZL data compression process compares characters in the inputted sequence to trace through respective entries in the dictionary to locate the dictionary entries representing the longest matched input strings, and to output the dictionary indices of these entries as the compressed data stream. The indices may be buffered and then transmitted in bursts of indices to maximize the efficiency of transmitting the compressed records or messages.

The AZL process modifies a dictionary for each separately inputted sequence of data characters, which may be the inputted characters in a data file, or in a computer session being transmitted. The AZL process always continues the construction and modification of its AZL dictionary WHILE compressing data. An AZL dictionary is always changed by each new character string in the input stream of data being compressed. When the AZL dictionary becomes full, one of its valid string entries is deleted and replaced by a representation of each new character string being inputted.

The compressed output of the Ziv-Lempel process is represented by a sequence of dictionary indices representing the character strings detected in the input stream. Each index is expanded to the characters in the string it represents by accessing the string entry at that index and using pointers therefrom to access entries representing the characters in the string in a reverse order. Because of LRU entry replacement in an AZL dictionary, the index representation of a particular character string may change, such as if an entry is aged out of the dictionary and later is put back in the dictionary at a different index location when the string is again encountered in the input stream.

If data compressed by the AZL process is being transmitted, its AZL dictionary is not transmitted. Instead, an identical AZL dictionary (used for expansion) is constructed from the received compressed data (indices) at the receiving location in synchronism with the construction of the identical AZL compression dictionary at the sending location. Synchronized identity of the AZL dictionary structures is essential at both the sending and receiving locations, in order to expand the received compressed data into uncompressed data identical to the original uncompressed data.

Hence, the AZL process "dynamically adapts" its dictionary by continuously updating it to each newly inputted input string in the sequence. This is why the AZL dictionary is known as a "dynamic" or "adaptive" dictionary.

The AZL process may be used to perform compression/expansion at the same location, or at two different locations connected by data transmission. Only a single dictionary is used when performing compression/expansion at the same location, but separate identical dictionaries are needed when compression is done at one location and expansion is done at a different location.

Accordingly, the AZL process generates its dictionary(s) WHILE the data is being inputted for compression, whether the AZL process is performing compression and expansion at the same location, or at two different locations connected by data transmission.

An AZL dictionary can only handle records sequentially accessed from a data base, since its structure is totally dependent on the sequential nature of its inputted records. An AZL process does not expand records randomly accessed from a data base in a different order than the records used in the current construction of its AZL dictionary.

Thus, the AZL process is totally dependent on the sequential relationship of the characters currently being inputted for compression. For example, if the same set of records are inputted in two different sequences for compression by the same Ziv-Lempel process, each sequence will generate a different dictionary, and the same uncompressed record will likely generate a compressed record containing a different set of indices in the two sequences. Thus, the AZL process has an "input-record-order dependency", due to the AZL dictionary(s) being generated DURING the inputting of uncompressed data for compression.

A computer operates inefficiently with the AZL process when its input stream is comprised of "randomly-obtained" data, such as "randomly-accessed" small records or "randomly-determined" small messages represented in a data base. AZL processing must build a new AZL dictionary for every sequence of "randomly-obtained" records or input message. This is because the building an AZL dictionary DURING the inputting of a "random-obtained" sequence of records (or messages) ties the dictionary to that particular sequence, and it cannot be used efficiently with any other "randomly-obtained" sequence of records. This prevents an AZL dictionary generated for any randomly-obtained data from being used with any other randomly-obtained data.

The computer-efficiency problem with records randomly-obtained from a data base is solved by the static Ziv-Lempel (SZL) process described and claimed in patent application Ser. No. 07/968,631 entitled "Method and Means Providing Static Dictionary Structures for Compressing Character Data and Expanding Compressed Data", filed Oct. 19, 1992 and assigned by the same assignee as the subject application.

The SZL process generates its SZL dictionary(s) BEFORE (and not while) it is used to compress or expand any record in the data base. The SZL dictionary is generated from ALL uncompressed records in a data base. The resulting compressed records may be stored to provide a compressed form of that data base which occupies only a fraction of the storage of the uncompressed data base.

The SZL process allows any individual record in the data base (whether compressed or not) to be randomly accessed and expanded independent of other records, using the SZL dictionary without change (and no computer processing is used for any dictionary generation or updating). The compressed records may be expanded at the same location, or transmitted to another location where the expansion is done.

By generating an SZL dictionary from an entire uncompressed data base PRIOR TO using the data base, the same compressed record (same indices) is obtained regardless of the order in which that record is later obtained. Hence, it may later be randomly-obtained from the data base without any affect on its compressed form, unlike in the AZL process.

Accordingly, the SZL process generates an "SZL dictionary" that represents all of the strings within the records in a data base. (The term "records" is used in a generic sense to include any recorded sequence of characters, such as may be found in messages accessed from a data base.)

The invention in application Ser. No. 07/968,631 also discovered that an SZL dictionary used for compression need not be identical to an SZL dictionary used for expansion, as long as they use the same indices to represent the same character strings. That is, the content of SZL dictionary entries may be different for corresponding entries at the same index in the separate compression and expansion dictionaries. These paired SZL compression and expansion dictionaries are herein referred to as "corresponding" dictionaries, which may or may not be identical.

Increased computer efficiency is obtained by using separate corresponding SZL compression and expansion dictionaries, rather than identical dictionaries. Corresponding SZL compression and SZL expansion dictionaries may be used at the same location, or at different locations connected by data transmission.

If the expansion process is done at a location different from the compression process, all SZL corresponding dictionaries needed at the different locations may be constructed at any location having the uncompressed data base, and then the SZL dictionaries may be transmitted to any location wherever needed. Or if an identical copy of the uncompressed data base exists at plural locations, the corresponding dictionary(s) need at the location may be constructed there.

In a data transmission environment, the SZL dictionary may be transmitted to a receiving location after the dictionary is generated from the entire uncompressed data base at the sending location and before using the SZL dictionary. An SZL dictionary can be constructed at a receiving location only if the receiving location has the same uncompressed records and inputs them to the SZL process in the exact same input sequence as is used to generate the SZL dictionary at the sending location.

A "compressed-version of the data base" may be generated simultaneously with generation of the SZL dictionary(s). The compressed version of the data base may be used to randomly or sequentially obtained any record in the data base in compressed form.

No SZL dictionary is thereafter constructed during random-accessing operations of the data base, whether uncompressed or compressed records are being randomly-obtained at a location which is to transmit the record in compressed form. That is, the prior-constructed SZL dictionary(s) can then be used for the compression and/or expansion of records or messages randomly-obtained at any location.

Furthermore, the SZL process may also be used to compress and expand new or changed records or messages in the uncompressed data base AFTER the generation of the SZL dictionary. Any new character string in such new or changed record is compressed and expanded as containing one or more existing smaller character strings currently represented in the dictionary (due to being in the prior version of the data base).

The SZL process has been found to operate efficiently with randomly-obtained small compressed records, or messages, that need to be compressed and expanded at the same location, or need to be compressed at one location and transmitted to another location where the record is expanded.

Previously, it had been presumed that poor data compression would result from the Ziv-Lempel process if the AZL process was not used to continuously adapt its dictionary to its input data. This has not been found to be the case with SZL processes, as long as the data base does not change by a large amount. Thus, it has been found that the SZL process effectively compresses records randomly accessed from a data base as long as an excessive number of changes have not been made in the data base.

Thus, the SZL process allows an existing SZL dictionary(s) to be used with any sequence of records or messages randomly obtained in a large data base without constructing or modifying any new dictionary. That is, no processing is spent on modifying the SZL dictionary structure while using the SZL process for compressing and expanding any sequence of records. On the other hand, the AZL process requires a large amount of computer processing for modifying its AZL dictionary to adapt it to each sequence of randomly-obtained records. The result is that the AZL process is not as efficient as the SZL process, when used with new sequences of randomly-obtained small records and messages.

While the SZL process is being used, old uncompressed records may be updated and new uncompressed records may be added in the corresponding uncompressed data base at a central location containing the data base. Yet, the existing SZL dictionary(s) and any corresponding dictionary(s) at this and any other location need not be updated, in order to use these dictionaries to compress and expand the new and updated records in the data base, as long as the SZL dictionary(s) is not changed.

Computer operating efficiency is further enhanced by use of a novel structure for entries in the SZL dictionary disclosed and claimed in patent application Ser. No. 07/968,631, which obtains a further significant performance increase for a computer system (over prior art AZL processes). This novel SZL entry structure enables fewer accesses in the SZL dictionary than is required in conventional AZL dictionaries—for character-string-compare determinations within the dictionary entries. Reducing the comparative number of storage accesses for dictionary entries in memory (in addition to not having to spend processing on modifying the dictionary) enables this SZL process to be much faster than the AZL process (using computers having the same instruction execution rate).

SUMMARY OF THE INVENTION

The subject invention operates with a sequence of transmitted records (including messages). They may be obtained from a large data base. The sequence of records may be originated and transmitted by a human.

The records (messages) may be randomly-selected from a distantly-located uncompressed, or a compressed, data base by commands issued in a sequence by a human to a computer system, which may then then transmit them to the human in that sequence. The sequence may have a significant total number of characters (for example, over 1000 characters), even though any particular record or message in the sequence may be very small (for example, 3 characters).

The primary object of this invention is to reduce the amount of computer processing (over what was previously required using AZL processes) at both a sending location (retrieving and compressing data) and a receiving location (expanding the received compressed data), where the transmitted data is a sequence of records or messages.

Another object of this invention is to significantly speed up the data transmission of a sequence of uncompressed records, or messages, by not interrupting the transmission for computer processing eliminated by the SZL process (which is required by the AZL process).

A further object of this invention is to avoid having to previously generate an SZL dictionary for an entire data base in order to obtain some of the advantages of the SZL process.

Still another object of this invention is to use the AZL process to generate a limited SZL dictionary from only an initial subset of randomly-obtained records or messages obtained from a data base, and then be able to use the limited SZL dictionary for controlling the compression and expansion of subsequent records in a sequence of records being transmitted. Performance efficiency is increased in freezing an AZL dictionary and operating it as an SZL dictionary to eliminate the processing cycles of modifying the dictionary for each new input string. The eliminated processing cycles increases the system processing efficiency at least until a significant number of new strings are inputted and not found in the SZL dictionary, after which the dictionary may be changed to an AZL dictionary and further updated with new strings.

A further object of this invention is to provide a semi-static Ziv-Lempel process for use in data transmission by connecting the AZL and SZL processes with a switch-over control.

The invention starts by using an AZL process to compress an initial part of an inputted sequence of records or messages until a switch-over time is detected when the compression operation can be done more efficiently by the SZL process. At AZL to SZL switch-over time, the AZL process is ended, and a switch-over is made to the SZL process. An optional AZL-to-SZL dictionary translation process may be used to re-organize the SZL dictionary into the form taught in application Ser. No. 07/968,631, and the frozen form of the AZL dictionary may then be saved. The SZL process is then used until either the end of the inputted sequence, or an SZL to AZL switch-over signal is generated to signal a switch-over from the SZL to the AZL process, in which case the saved AZL dictionary may be retrieved and the AZL process in again invoked.

Thus, the SZL to AZL switch-over may be invoked whenever the SZL dictionary is found to need updating to maintain compression efficiency, due to an excessive amount of new strings occurring in the input stream. Even if an AZL to SZL dictionary translation was done in the AZL to SZL switch-over, an SZL to AZL switch-over does not need any dictionary translation process if the last version of the AZL dictionary has been saved, because last AZL dictionary represents the same data strings as are represented in the current SZL dictionary.

Any of several different ways may be used to determine the occurrence of the time to freeze, and the time to unfreeze the dictionary. One way to detect the time to freeze and unfreeze is by a character count, or record count, for the input stream, and to signal it upon detecting a predetermined count. The time to freeze may be signalled with a different count than the time to unfreeze. The counting technique is simple and operable, but is not the most compression-efficient way. A more precise way, although a more complicated way, is to monitor the compression ratio for each compressed record generated by the current compression process. The time to freeze may be determined when the compression ratio falls within an AZL-to-SZL predetermined range of compression ratios. And, time to unfreeze may be determined when a subsequent record has a compression ratio which falls outside of a predetermined SZL-to-AZL switch-over range. The SZL-to-AZL range be a larger range inclusive of the AZL-to-SZL range to minimize unnecessary switch-overs.

On the occurrence of a time to freeze at a location transmitting compressed records to another location, the transmitting location sends a switch-over signal to the each of its receiving locations. When the transmitting location and each of the receiving locations freezes its AZL dictionary to invoke the SZL process, any location may optionally do an AZL-to-SZL dictionary translation process to generate an SZL dictionary that can further increase system performance. For example, all locations may do a translation, or only the transmitting location may do a translation and not the receiving locations, or no location may do a translation. The greatest increase in performance efficiency obtained by AZL to SZL dictionary translation is by the transmitting location which is doing data compression, and the receiving locations doing data expansion obtain a lesser increase in efficiency.

It is therefore still another object of this invention to provide an optional AZL-to-SZL dictionary translation process, which may be used by the invention for changing a frozen AZL dictionary (making it an SZL dictionary) into a more efficient SZL dictionary.

It is a further object of this invention to also enable an SZL-to-AZL switch-over by merely invoking the use of the last saved AZL dictionary when a SZL dictionary translation was done, since this saves having to do any translation back to the AZL dictionary form. Then, the saved AZL dictionary again starts being modified by new strings thereafter occurring in the character input stream.

The semi-static process continues to alternate its switch-overs between the AZL and SZL processes until the input character string ends.

Thus, the AZL dictionary freeze time, and unfreeze time, dynamically determined when a switch-over between AZL and SZL processes can significantly improve processing efficiency. Thus, the computer processing overhead associated with AZL processing is eliminated while the SZL process is being used.

Switch-over signalling is provided in the transmitted stream of indices (representing the compressed data) in any of several different ways, such as by transmitting a pre-determined special index value as an escape character in, or between, compressed records being transmitted. The escape character is immediately followed by a predetermined number of characters (one or more) which indicate the type of switch-over to do at each receiving location to maintain synchronism of AZL/SZL processing and dictionary states at both the sending and receiving locations.

The SZL dictionary translation process obtains an SZL dictionary in the form disclosed and claimed in application Ser. No. 07/968,631, which speed up the SZL compression process by containing child and/or sibling characters in dictionary entries, and speeds up the SZL expansion process by containing ancestor characters in child dictionary entries. The SZL translation process may convert a frozen AZL dictionary into one or both of two separate SZL dictionaries—a SZL compression dictionary and an SZL expansion dictionary. The SZL translation process may convert an AZL dictionary into a single dictionary for performing both compression and expansion.

The SZL dictionary translation process may result in an SZL dictionary having more entries than the corresponding frozen AZL dictionary, since the resulting SZL dictionary may contain child, sibling and ancestor entries not found in the corresponding AZL dictionary.

SUMMARY OF THE DRAWINGS

FIG. 1A and FIG. 1B together provide a flow-diagram of a process which embodies the invention.

DETAILED DESCRIPTION OF THE EMBODIMENT

Figure 1B:
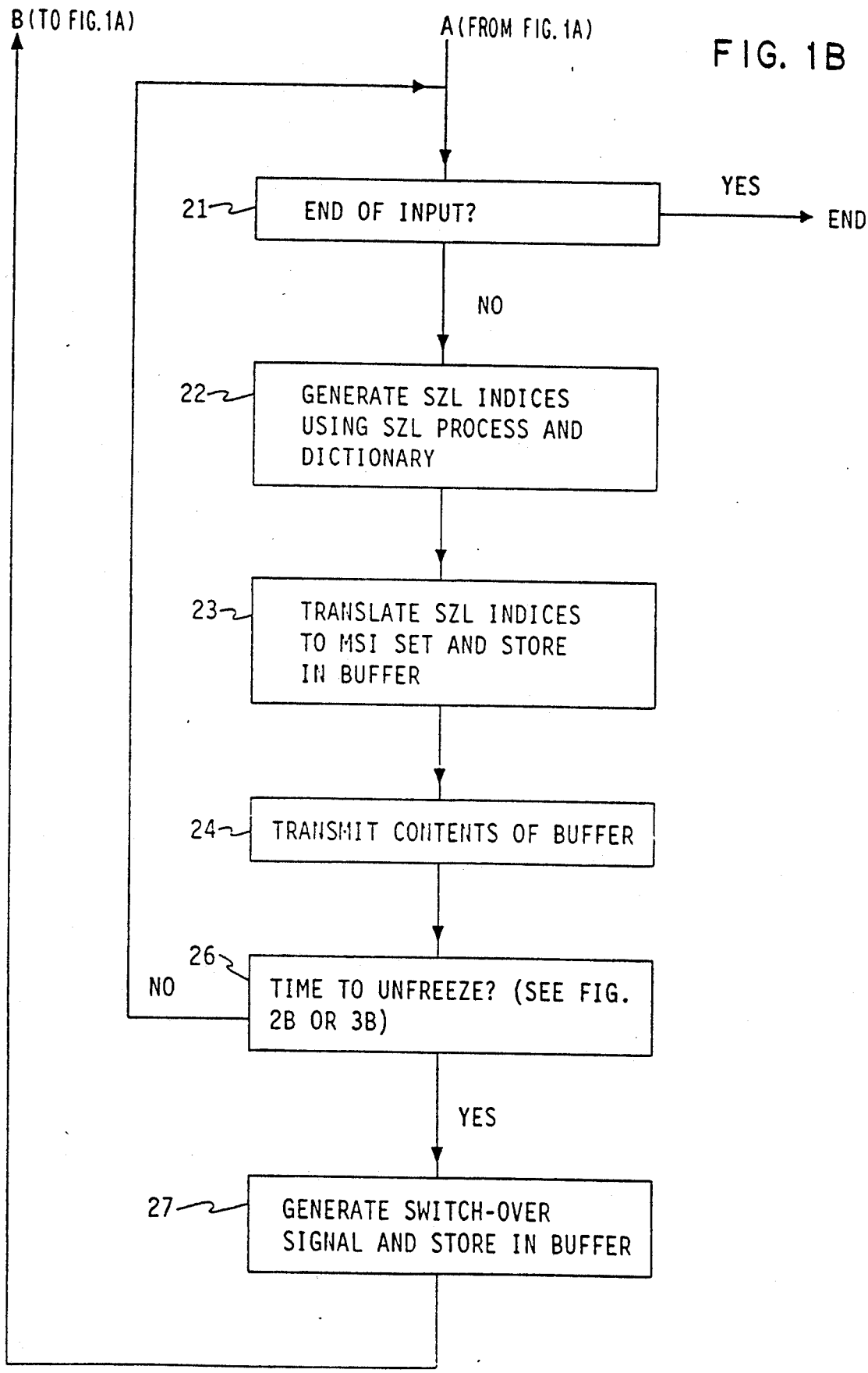

FIGS. 1A and 1B represent a semi-static compression process which starts using the AZL process. The SZL process remains dormant until a switch-over signal is generated later in the process.

A character stream (comprising a sequence of records or messages) is provided to step 11, as an input to the process in FIG. 1A. Step 11 tests the input stream for an end of the input stream. If step 11 detects the end of the input stream, it takes its yes exit to end the compression process.

Step 12 is entered if step 11 does not detect the end of the input stream by taking the no path. Step 12 generates AZL indices in the conventional manner, and stores them in a buffer. Step 13 transmits the indices stored in the buffer when it is full, or when step 11 detects the end of the input stream. The transmitted indices are sent by a communication means (telephone wire, optical fiber, etc.) to a receiving location which expands the compressed data (represented by the transmitted indices).

The receiving location constructs an AZL dictionary from the received indices in the conventional manner, which is done in parallel with the construction of a corresponding AZL dictionary at the sending location. Therefore, the transmitted indices are immediately used at the receiving location to construct an AZL dictionary which is identical to the AZL dictionary being constructed at the sending location. The AZL dictionaries at the two locations are constructing the same entries at substantially the same time (with only the transmission time intervening, so that they are considered to be constructed in synchronism in the same state as the other.

The process performed by steps 12 and 13 iterate until step 14 has determined the occurrence of a time to freeze signal at the transmitting location. In step 14, the time to freeze signal is generated by a sub-process, such as represented by either FIG. 2 or 3. The time to freeze signal cause the current state of the AZL dictionary to be frozen, which then causes it to become an SZL dictionary since it is then used in a static mode without being adapted to any new input strings that may be received in the input record stream.

The time to freeze signal in step 14 is generated at the transmitting location, at which time it freezes its current AZL dictionary, which cause it to become an SZL dictionary.

The preferred form of the time to freeze signal is to use of a special index-like value in the transmitted compression stream which is a different value from all usable indices. The transmitted time to freeze signal enables the AZL dictionaries at all receiving locations to be synchronized with the AZL dictionary at the transmitting location without any time dependent signalling protocol among the locations. By using a special value in the index stream different from any of the available index values, the special value indicates at what index point in the transmitted compression stream the construction of all AZL dictionaries are synchronized.

Next, an optional step 16 is performed in the preferred embodiment at the transmitting location, because the SZL translation of the frozen SZL dictionary obtains its greatest performance increase at the transmitting location doing data compression. The SZL dictionary is translated into the SZL dictionary disclosed in application Ser. No. 07/968,631. The frozen form of the AZL dictionary is then stored in memory.

Thus, the translation process in step 16 translates the AZL dictionary from the frozen AZL form into an SZL dictionary(s) of the type disclosed in detail in application Ser. No. 07/968,631 previously cited herein. The transmission in the preferred embodiment is unidirectional, and the sending location needs only to perform data compression, and each receiving location needs only to perform data expansion. If the transmission is bidirectional, separate dictionaries are used for the sending and receiving operations at each location.

During the SZL translation process of step 16, the AZL dictionary is stored in the computer memory in its currently-existing form, where it is kept in a dormant state until it is needed again (and if it is needed again) by a later time to unfreeze signal by step 26. (It is possible that the input stream will end before any time to unfreeze signal is provided by step 26, such as if a yes path from step 21 is taken to end the SZL processing before any time to unfreeze signal occurs.)

Upon completion of the translation process of step 16 at the transmitting location, the translated SZL dictionary optionally may be used at only the transmitting location, and the frozen AZL type of SZL dictionary used at each receiving location. Then, the translated SZL dictionary is not transmitted to any other location. But any receiving location may optionally perform the SZL translation operation upon its frozen dictionary to improve its performance.

A still further option is that none of the locations (transmitting or receiving) operates with any translated SZL dictionary, and all locations then operate with their frozen AZL dictionary used as their SZL dictionary.

Step 17 is entered in the preferred embodiment upon the transmitting location completing its translation operation in step 16. (If no translation step 16 is performed, step 17 is entered directly from step 14.) Then, the transmitting location generates an AZL-to-SZL switch-over signal and sends it to all receiving locations. All receiving locations use the received switch-over signal to start using the SZL process with their chosen form of SZL dictionary. If any receiving location wants to use the translated form of the SZL dictionary, it can first perform the translation operation before using its SZL dictionary. All locations must synchronously use their SZL dictionaries from the switch-over character in the transmitted index stream.

Then, the SZL dictionary resulting from step 16 is used after the switch-over by step 17 to compress the input character stream at the transmitting location, instead of using the AZL dictionary. Each receiving location also then begins using its SZL dictionary to expand the received compressed data.

Connector A in FIG. 1A connects the output of step 17 to the input to step 21 in FIG. 1B to continue the process of the preferred embodiment. Step 21 tests for the end of input of the current record sequence being inputted to the SZL compression process. Step 21 operates like step 11 (except for operating with the SZL process instead of the AZL process). If the end of input has not yet been reached, the no path is taken to step 22, in which the SZL process uses the SZL dictionary to continue to compress the input character stream (instead of using the AZL dictionary) in the manner previously described herein.

Step 23 translates each SZL index generated by the SZL process into a corresponding MSI (minimal size Index). The indices in the corresponding AZL dictionary (now stored) are in MSI form. An index translation is done for each translated SZL dictionary index to a corresponding MSI for the same input string to enable any receiving location (not having a translated dictionary) to find the correct index in its dictionary for expanding the respective string. Also, using the MSI indices may reduce the number of transmitted bits for the compressed data to speed up the data transmission. That is, the AZL dictionary may have fewer indices than the SZL dictionary(s), due to duplicated characters in SZL dictionary entries to support duplicate child, sibling and ancestor characters (which are not duplicated in an AZL dictionary). Although the duplicate characters in an SZL dictionary may cause more indices than in the corresponding AZL dictionary, the SZL dictionary enables faster processing due to these duplicate characters. The fewer indices in an AZL dictionary enable each of its indices to possibly be represented by fewer bit positions than corresponding indices in an SZL dictionary. The criteria is whether the number of bit positions per index representation in the SZL dictionary requires a greater power of 2 than is required to represent the number of bit positions per index representation in the AZL dictionary. For example, the transmission rate may be speeded up by about 8 percent if one less bit position is used in the MSI set, such as if the AZL dictionary requires less than 4096 indices (requiring 11 bits to represent each index), compared to an SZL dictionary requiring more than 4096 indices (requiring 12 bits to represent each index).

In step 23, the resulting MSI indices being provided for the SZL process are temporarily stored in a buffer, which may be the same buffer previously used by step 12. Step 24 transmits the contents of the buffer whenever it is full, or when the end of the input stream is detected by a yes path signal from step 21, or when a time to unfreeze signal is provided by the next step 26.

Step 26 operates with the records received by the SZL process to detect a time to unfreeze signal. Step 26 does this by detecting when the efficiency of the SZL process falls below a predetermined threshold, examples of which are described in detail for FIG. 2B or 3B. The no path is taken from step 26 if the SZL process is currently operating above the predetermined efficiency threshold.

If step 26 indicates the SZL process is currently operating below the predetermined efficiency threshold, the yes path is taken to step 27. Step 27 generates an AZL switch-over signal which is stored in the transmission buffer and transmitted to each receiving location, which preforms a switch-over to the AZL process at the corresponding switch-over character in the compressed data stream in synchronism with the switch-over at the transmitting location. The switch-over operation at each of these locations retrieves its frozen corresponding AZL dictionary from storage and re-activates the AZL process, by branching back to step 11 in FIG. 1A. The process in FIGS. 1A and 1B then continue in the manner previously described until the end of the input record stream is detected by step 11 or 21.

The switch-over for the unfreezing sub-process for steps 26 and 27 is simpler than the freezing sub-process for steps 14, 16 and 17 when an SZL dictionary translation has been done, because unfreezing sub-process merely activates the last frozen AZL dictionary by retrieving it from storage.

Figure 2A:
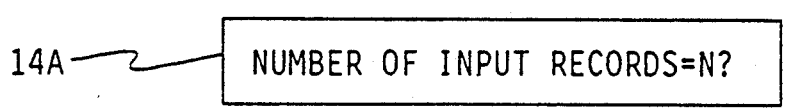
FIG. 2A represents a character counting implementation of step 14 in FIG. 1A.
Figure 2B:
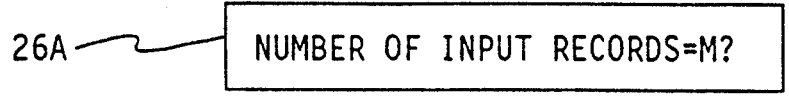
FIG. 2B represents a character counting implementation of step 26 in FIG. 1B.

Count Freeze and Unfreeze Detection—FIGS. 2A and 2B

FIGS. 2A and 2B show one type of implementation for the time to freeze sub-process in step 14 in FIG. 1A, and for the time to unfreeze sub-process in step 26 in FIG. 1B, respectively.

The implementation in step 14A in FIG. 2A provides a sub-process that counts the number of input characters being provided for compression to the AZL process in FIG. 1A.

The AZL character count is reset to zero whenever a time to freeze signal, or a time to unfreeze signal is provided by either step 14 or 26. A time to freeze signal is provided when the input character count to the current AZL process reaches a predetermined value of N. This character count for step 14 is done in association with the input record character operations done in step 11 in FIG. 1A which receives the input characters and detects the end of the input stream.

Figure 3A:
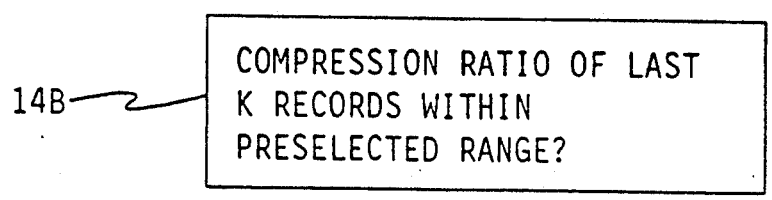
FIG. 3A represents a compression ratio range implementation of step 14 in FIG. 1A.
Figure 3B:
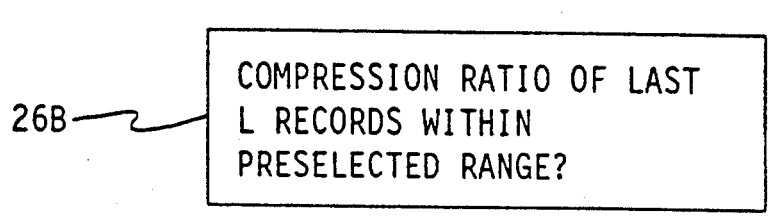
FIG. 3B represents a compression ratio range implementation of step 26 in FIG. 1B.

The implementation in step 26A in FIG. 3B provides a similar process that counts the number of input record characters being provided for compression to the SZL process in FIG. 1B. The SZL character count is reset to zero whenever a time to freeze, or a time to unfreeze signal is provided by either step 14 or 26. A time to unfreeze signal is provided for unfreezing the AZL process when the input character count to the SZL process reaches a predetermined value of M. This character count may be done in association with the operations in step 21 in FIG. 1B which receives the input characters and detects the end of the input stream.

The implementation in FIGS. 2A and 2B presumes that when input record count N is reached in the AZL process, the AZL dictionary has developed to the point that the SZL process would be more efficient than the AZL process. The implementation is FIGS. 2A and 2B also presumes that when the next input record count M is reached in the SZL process, the SZL process has become less efficient than the AZL process due to an assumed significant number of new character strings being in the M records that were not in the prior cumulative N records.

Ratio Freeze and Unfreeze Detection—FIGS. 3A and 3B

The implementation in step 14B in FIG. 3A and in step 26B in FIG. 3B provides a process that is a very different from the type of implementation for steps 14 and 26 shown in FIGS. 2A and 2B, respectively. The sub-processes in FIGS. 3A and 3B may be more effective, and are more complex, than the simple counting detection technique used in FIGS. 2A and 2B.

The implementation in FIG. 3A generates and monitors a compression ratio for each record inputted to the AZL compression process. It does this by counting the number of input characters in each inputted record to obtain an "input record character count", and also counting the number of indices (index symbols) outputted for that record to obtain an "output record index count". A "record compression ratio" is then obtained by dividing the the "output record index count" by the "input record character count" for the AZL process.

Also, an "AZL-to-SZL switch-over range" is predetermined. When a "record compression ratio" for the AZL process falls within the AZL-to-SZL switch-over range, a time to freeze signal is generated by step 14 and transmitted to the receiving locations.

After a switch-over is made to the SZL process, its "record compression ratio" is then likewise obtained by dividing its "output record index count" by its "input record character count". And, an "SZL-to-AZL switch-over range" is also predetermined. When the "record compression ratio" during the SZL process falls outside the SZL-to-AZL switch-over range, a time to unfreeze signal is generated by step 26.

The "AZL-to-SZL switch-over range" may be equal to the "SZL-to-AZL switch-over range". However, it may be preferable to make the "AZL-to-SZL switch-over range" less than, and within, the "SZL-to-AZL switch-over range", in order to prevent excessive switch-overs that may reduce the efficiency of the system.

Averaging the Detected Compression Ratios—FIGS. 3A and 3B

An alternative to using the "record compression ratio" of each inputted record as described in the preceding section is to use an "average compression ratio" which is a moving average of the last R number of "record compression ratios", for the last R number of inputted records. An "average compression ratio" is calculated after each newly inputted record.

The average compression ratio is then used in the same manner as the record compression ratio (after receiving the first R number of records), by comparing it against the "AZL-to-SZL switch-over range" during the AZL process, and by comparing it against the "SZL-to-AZL switch-over range" during the SZL process.

Using the average compression ratio, instead of the record compression ratio, may provide more stable switch-over control and increase the system efficiency by reducing the possibility of unnecessary time to freeze signals and of unnecessary time to unfreeze signals.

And likewise, the SZL-to-AZL range may be equal to, or smaller than and within the AZL-to-SZL range to minimize unnecessary switch-overs.

Many variations and modifications are shown which do not depart from the scope and spirit of the invention and will now become apparent to those of skill in the art. Thus, it should be understood that the above described embodiments have been provided by way of example rather than as a limitation.

Having thus described our invention, what we claim as new and desire to secure by Letters Patent is:

1. A method of transmitting compressed data using a well-known Ziv-Lempel (ZL) compression/expansion algorithm, comprising the steps of:

inputting a sequence of records containing characters of data to an adaptive Ziv-Lemel (AZL) process at a transmitting location for compressing the data including: generating an AZL dictionary in computer storage by inserting an entry therein at an assigned index for each inputted character string not found in the dictionary, detecting indicies in the dictionary for the inputted character strings in the sequence of records to represent compressed records; and transmitting the compressed records to a receiving location;

generating a corresponding AZL dictionary at the receiving location from received indices of the transmitted compressed records;

freezing the AZL dictionary to maintain its current content at the transmitting location to provide an SZL (static Ziv-Lempel) dictionary when the AZL dictionary has been generated to a mature state to enable SZL processing; and sending a switch-over signal by the transmitting location to the receiving location to indicate a synchronization point in the sequence of transmitted compressed records to enable the receiving location to freeze the corresponding AZL dictionary with an identical current content for enabling an SZL process to expand data by statically using the current content following the synchronization point in the transmitted compressed records.

2. A method of transmitting compressed data using a well-known Ziv-Lempel (ZL) compression/expansion algorithm, comprising the step of:

inputting a sequence of records containing characters of data to an adaptive Ziv-Lempel (AZL) process at a transmitting location for compressing the data including: generating an AZL dictionary in computer storage by inserting an entry therein at an assigned index for each inputted character string not found in the dictionary, and detecting the indicies in the dictionary and transmitting to a receiving location the indices assigned to the inputted character strings in the sequence of records to represent transmitted compressed records;

generating a corresponding AZL dictionary at the receiving location from received indices of the transmitted compressed records;

freezing the AZL dictionary at the transmitting location to provide an SZL (static Ziv-Lempel) dictionary when the AZL dictionary has been generated to a mature state to enable SZL processing (which does not change the SZL dictionary);

sending a switch-over signal by the transmitting location to the receiving location to indicate a synchronization point in the sequence of transmitted compressed records to enable the receiving location to freeze the corresponding AZL dictionary for enabling an SZL process to expand data following the synchronization point in the transmitted compressed records; and translating the frozen AZL dictionary in to a more processing-efficient corresponding SZL dictionary at the transmitting location by copying child character(s) of each extension character into an entry for the extension character to reduce storage accesses for child entries in the dictionary to speed up SZL processing for compressing subsequent records.

3. A method of transmitting compressed data using a well-known Ziv-Lempel (ZL) compression/expansion algorithm as defined in claim 2, comprising the step of:
converting each index detected in the SZL dictionary into a corresponding index for a same character string in the frozen AZL dictionary, and transmitting converted indices to the receiving location as the transmitted compressed records to enable the frozen SZL dictionary to be used at the receiving location for expanding data in the compressed record.

4. A method of transmitting compressed data using a well-known Ziv-Lempel (ZL) compression/expansion algorithm as defined in claim 2, comprising the step of:
storing the indices and the switch-over signal in a transmission buffer at the transmitting location in preparation for transmitting compressed data to the receiving location.

5. A method of transmitting compressed data using a well-known Ziv-Lempel (ZL) compression/expansion algorithm as defined in claim 2, comprising the step of:
generating a switch-over signal as a predetermined value not used as an index in the frozen AZL dictionary.

6. A method of transmitting compressed data using a well-known Ziv-Lempel (ZL) compression/expansion algorithm as defined in claim 2, comprising the step of:
completing operation by AZL and SZL processes upon detecting an end of a sequence of records being inputted for compression.

7. A method of transmitting compressed data using a well-known Ziv-Lempel (ZL) compression/expansion algorithm as defined in claim 2, comprising the step of:
storing the frozen AZL dictionary in processor storage when a time to freeze signal is provided.

8. A method of transmitting compressed data using a well-known Ziv-Lempel (ZL) compression/expansion algorithm as defined in claim 2, comprising the step of:
providing a time to unfreeze signal at the transmitting location by detecting that greater data compression is available by switching from the SZL process to the AZL process.

9. A method of transmitting compressed data using a well-known Ziv-Lempel (ZL) compression/expansion algorithm as defined in claim 8, comprising the step of:
retrieving the stored AZL dictionary from storage at the transmitting location in response to a time to the unfreeze signal.

10. A method of transmitting compressed data using a well-known Ziv-Lempel (ZL) compression/expansion algorithm as defined in claim 9, comprising the step of:
generating a switch-over signal at the transmitting location in response to a time to unfreeze signal.

11. A method of transmitting compressed data using a well-known Ziv-Lempel (ZL) compression/expansion algorithm as defined in claim 10, comprising the steps of:

buffering the transmitted indices and the switch-over signal in a transmission buffer for transmission to each receiving location;

transmitting the switch-over signal to each receiving location to synchronize a switching to the AZL process using the frozen AZL dictionary at each receiving location with the switch-over at transmitting location; and invoking the AZL process at each location.

12. A method of transmitting compressed data using a well-known Ziv-Lempel (ZL) compression/expansion algorithm as defined in claim 11, comprising the step of:
inserting the switch-over signal into the transmitted compressed records to synchronize the switch-over operations at both the transmitting and receiving locations.

13. A method of transmitting compressed data using a well-known Ziv-Lempel (ZL) compression/expansion algorithm as defined in claim 12, comprising the step of:
counting N number of characters from the beginning of the AZL process to generate a time to freeze signal when the count of N is reached at the transmitting location.

14. A method of transmitting compressed data using a well-known Ziv-Lempel (ZL) compression/expansion algorithm as defined in claim 12, comprising the step of:
counting M number of characters from the beginning of the SZL process to generate a time to unfreeze signal when the count of M is reached at the transmitting location.

15. A method of transmitting compressed data using a well-known Ziv-Lempel (ZL) compression/expansion algorithm as defined in claim 10, comprising the steps of:
counting the number of characters in an inputted record provided to the AZL process, counting the number of characters in a compressed record generated from the inputted record, and obtaining a record compression ratio by dividing the number of characters in the compressed record by the number of characters in the inputted record; and generating a time to freeze signal when the record compression ratio is within a predetermined range of ratios for indicating a switch-over to the SZL process.

16. A method of transmitting compressed data using a well-known Ziv-Lempel (ZL) compression/expansion algorithm as defined in claim 10, comprising the steps of:
counting the number of characters in an inputted record provided to the SZL process, counting the number of characters in a compressed record generated from the inputted record, and obtaining a record compression ratio by dividing the number of characters in the compressed record by the number of characters in the inputted record; and generating a time to unfreeze signal when the record compression ratio is outside of a predetermined range of ratios for indicating a switch-over to the AZL process.

17. A method of transmitting compressed data using a well-known Ziv-Lempel (ZL) compression/expansion algorithm as defined in claim 10, comprising the steps of:
- counting the number of characters in an inputted record provided to the AZL process, counting the number of characters in a compressed record generated from the inputted record, and obtaining a record compression ratio by dividing the number of characters in the compressed record by the number of characters in the inputted record;
- averaging the last R number of record compression ratios generated for the inputted sequence of records to obtain an average compression ratio; and
- generating a time to freeze signal when the average compression ratio is within a predetermined range of ratios for indicating a switch-over to the SZL process.

18. A method of transmitting compressed data using a well-known Ziv-Lempel (ZL) compression/expansion algorithm as defined in claim 10, comprising the steps of:
- counting the number of characters in an inputted record provided to the SZL process, counting the number of characters in a compressed record generated from the inputted record, and obtaining a record compression ratio by dividing the number of characters in the compressed record by the number of characters in the inputted record;
- averaging the last R number of record compression ratios generated for the inputted sequence of records to obtain an average compression ratio; and
- generating a time to unfreeze signal when the average compression ratio is outside of a predetermined range of ratios for indicating a switch-over to the AZL process.

* * * * *